(12) United States Patent
Joseph

(10) Patent No.: US 6,441,689 B1
(45) Date of Patent: Aug. 27, 2002

(54) TRANSISTOR AMPLIFIER PROVIDING IMPROVED LINEAR AND RETURN LOSS PERFORMANCE CHARACTERISTICS

(75) Inventor: Leyo Joseph, Irving, TX (US)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/758,749

(22) Filed: Jan. 11, 2001

(51) Int. Cl.[7] ............................................. H03F 3/191
(52) U.S. Cl. ...................................... 330/302; 330/294
(58) Field of Search ................................ 330/294, 302; 333/32

(56) References Cited

U.S. PATENT DOCUMENTS

| | | | |
|---|---|---|---|
| RE29,844 E | | 11/1978 | Seader et al. |
| 5,117,203 A | * | 5/1992 | Tennyson .................... 330/302 |
| 5,491,450 A | * | 2/1996 | Helms et al. ................ 330/294 |
| 6,204,728 B1 | * | 3/2001 | Hageraats ................... 330/294 |

* cited by examiner

Primary Examiner—Robert Pascal
Assistant Examiner—Khanh Van Nguyen
(74) Attorney, Agent, or Firm—Thomas B. Hayes

(57) ABSTRACT

A transistor amplifier utilizes a dual loop feedback control circuit and an impedance matching circuit to provide improved linear and return loss performance characteristics. The transistor amplifier comprises a transistor for linearly amplifying an input signal, the transistor having a base, a collector and an emitter, the base having an input impedance, the collector having an output impedance. The dual loop feedback control circuit comprising a series feedback resistor electrically coupled between the emitter and a ground potential and a shunt feedback resistor electrically coupled between the collector and base. The dual loop feedback control circuit converts the input impedance to a conjugate of a source resistance and the output impedance to optimum load impedance. The impedance matching circuit electrically coupled between the collector and a receiving circuit converts a load resistance to a conjugate of the output impedance and the output impedance to a conjugate of a load resistance at a predetermined frequency.

19 Claims, 2 Drawing Sheets

TRANSISTOR AMPLIFIER PROVIDING IMPROVED LINEAR AND RETURN LOSS PERFORMANCE CHARACTERISTICS

FIELD OF THE INVENTION

The present invention relates, in general, to transistor amplifiers, and more specifically, to a transistor amplifier utilizing feedback control and impedance matching to provide improved linear and return loss performance characteristics.

BACKGROUND OF THE INVENTION

Without limiting the scope of the invention, its background is described in connection with a transistor amplifier.

Transistor amplifiers, for example, transistor amplifiers used in the receiver or transmitter chain of mobile communications equipment, may require specific amount of linear power with minimum distortion and a select amount of gain. The amount of linear power and gain may be provided by properly biasing the transistor amplifier. Proper biasing provides the linear power and gain required for a specific application. However, biasing the transistor amplifier also produces input and output impedance. The input and output impedance must also be a conjugate match with the impedance of terminating circuitry to minimize return loss and therefore maintain the amount of gain selected.

A transistor amplifier designed for a specific amount of linear power and a select amount of gain may result in an impedance mismatch with terminating circuitry causing a return loss and therefore a decrease in gain. Therefore, often a transistor amplifier is designed with a compromise in either the amount of linear power provided or the amount of gain delivered. If a specific amount of linear power is required, depending on terminating circuitry a certain amount of gain degradation due to return loss may be accepted. If a select amount of gain is required, the transistor amplifier may be biased for a compromised amount of linear power so that minimal return loss may be realized.

Prior techniques may have included compromising between the amount of linear power provided or the amount of gain delivered or additional circuitry may have been added to isolate the transistor amplifier from terminating circuitry so that a select amount of linear power and gain could be realized. A prior art transistor amplifier may have been biased for a select amount of linear power without consideration of terminating circuitry by utilizing an isolator to isolate the transistor amplifier from the terminating circuitry. An isolator used to provide isolation between the transistor amplifier and the terminating circuitry provides the impedance match required to minimize return loss without affecting the amount of gain and linear power provided. However, isolating circuitry significantly increases size and cost.

As may be seen, a transistor amplifier providing improved linear and return loss performance characteristics could prove to be a useful article of manufacture.

SUMMARY OF THE INVENTION

The present invention provides an improved transistor amplifier providing improved linear and return loss performance characteristics.

A transistor amplifier utilizes a dual loop feedback control circuit and an impedance matching circuit to provide improved linear and return loss performance characteristics. The transistor amplifier for coupling between a sending circuit providing a RF signal containing modulated information at a predetermined frequency and a receiving circuit having a load resistance receiving an RF output signal having improved linear and return loss performance characteristics. The transistor amplifier utilizes dual loop feedback control to provide output impedance required for a select amount of linear power. The transistor amplifier further utilizes impedance matching circuitry to allow a conjugate match between the output impedance and the load resistance allowing for the delivery of a select amount of linear power with minimal return loss.

In an embodiment, the transistor amplifier comprises a transistor for linearly amplifying the input signal, the transistor having a base, a collector and an emitter, the base having an input impedance, the collector having an output impedance. The dual loop feedback control circuit comprises a series feedback resistor electrically coupled between the emitter and a ground potential and a shunt feedback resistor electrically coupled between the collector and base. The dual loop feedback control circuit converts the input impedance to a conjugate of the source resistance and the output impedance to optimum load impedance. The impedance matching circuit electrically coupled between the collector and the receiving circuit converts the load resistance to a conjugate of the output impedance and the output impedance to a conjugate of the load resistance at the predetermined frequency.

BRIEF DESCRIPTION OF THE DRAWINGS

For a more complete understanding of the present invention, including its features and advantages, reference is made to the detailed description of the invention, taken in conjunction with the accompanying drawings of which.

DETAILED DESCRIPTION OF THE INVENTION

While the use and implementation of particular embodiments of the present invention are presented in detail below, it will be understood that the present invention provides many inventive concepts, which can be embodied in a wide variety of contexts. The specific embodiments discussed herein are mere illustrations of specific ways for making and using the invention and are not intended to limit the scope of the invention.

Figure 1:
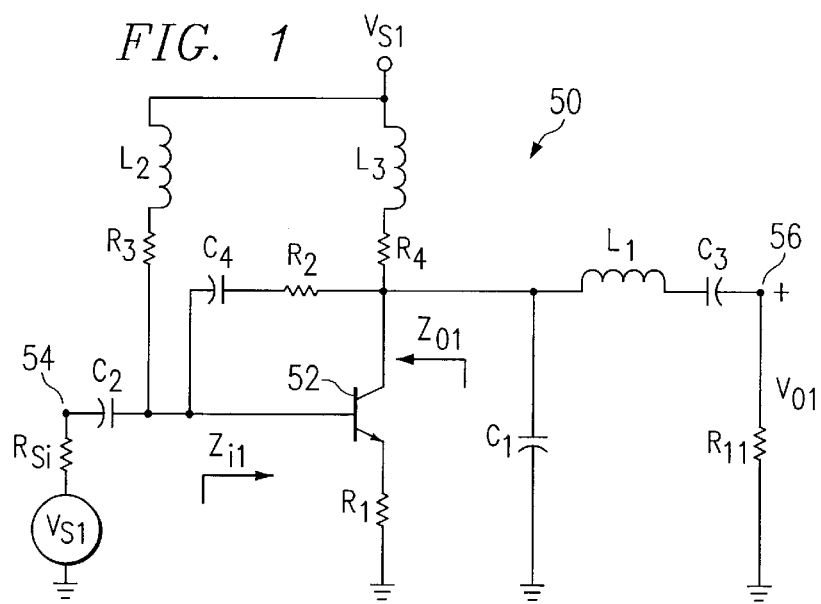
FIG. 1 is a transistor amplifier according to an embodiment of the invention having improved linear and return loss performance characteristics.

Referring now to FIG. 1, therein is illustrated a transistor amplifier having improved linear and return loss performance characteristics denoted generally as 50. Transistor amplifier 50 utilizes dual loop feedback control and an impedance matching circuit to provide improved linear and return loss performance characteristics. Transistor amplifier 50 comprises a transistor 52 having a base, emitter and collector in a Common Emitter (CE) configuration, a RF input 54 and a RF output 56. Transistor 52 may be a Bipolar Junction Transistor (BJT) having a CE configuration. Transistor amplifier 50 is characterized by a input impedance $Z_{il}$ at the base and a output impedance $Z_{o1}$ at the collector. RF input 54 is electrically coupled to a sending circuit for sending a signal having modulated information at a predetermined frequency. The sending circuit represented as a voltage source $V_{s1}$ and a source resistance $R_{s1}$. RF output 56 is electrically coupled to a receiving circuit for receiving a RF output signal $V_{o1}$. RF output signal $V_{o1}$ contains an amplified RF modulated signal having improved linear and return loss performance characteristics. The receiving circuit represented as a load resistance $R_{l1}$.

Transistor amplifier 50 further comprises dual loop feedback control circuit comprising a series feedback resistor $R_1$ electrically coupled between the emitter and ground potential and a shunt feedback resistor $R_2$ electrically coupled between the collector and the base. The dual loop feedback control circuit converts input impedance $Z_{i1}$ to a conjugate of source resistance $R_{s1}$ and output impedance $Z_{o1}$ to an optimum load. The optimum load defined as an amount of output impedance $Z_{o1}$ required for transistor 52 to provide maximum linear power. Transistor amplifier 50 further comprises an impedance matching circuit comprising a capacitor $C_1$ and an inductor $L_1$ electrically coupled between the collector and RF output 56. The impedance matching circuit converts load resistance $R_{l1}$ to a conjugate of output impedance $Z_{o1}$ and output impedance $Z_{o1}$ to a conjugate of load resistance $R_{l1}$.

Transistor amplifier 50 further comprises a bias network for biasing transistor 52. The bias network comprises a bias voltage source $V_{s1}$ electrically coupled to the base through an inductor $L_2$ and a resistor $R_3$ and to the collector through an inductor $L_3$ and a resistor $R_4$. The inductor acts as a choke for RF signals and a short circuit for DC signals. The bias network further includes a capacitor $C_2$ in series with input terminal 54 and a capacitor $C_3$ in series with output terminal 56 and a capacitor $C_4$ in series in the shunt feedback path. Capacitor $C_2$, $C_3$ and $C_4$ act as a Direct Current (DC) blocking capacitors, which creates an open circuit for DC and a short circuit for RF signals.

The voltage gain $G_V$, input impedance $Z_{i1}$ and output impedance $Z_{o1}$ of transistor amplifier 50 can be characterized by the following equations:

$$G_v = \frac{V_{ol}}{V_{sl}} = \frac{R_{ll}}{R_1}; \quad \text{Eq. 1}$$

$$Z_{il} \cong V_{sl} \cdot \frac{R_2}{V_{ol}} = \frac{R_2}{G_v} = R_2 \cdot \frac{R_1}{R_{ll}} \quad \text{Eq. 2}$$

$$Z_{ol} \cong \frac{V_{ol}}{I_c}; V_{ol} = V_{sl} \cdot \frac{R_2}{R_{sl}}, (R_2 \gg R_{sl}) \quad \text{Eq. 3}$$

$$I_c \cong V_{ol} \cdot \frac{R_{sl}}{R_2 \cdot R_1}, V_{sl} = V_{ll} \cdot \frac{R_{sl}}{R_2}$$

$$Z_{ol} \cong R_2 \cdot \frac{R_1}{R_{sl}}$$

The power gain is given in equation 4.

$$G_p = \frac{P_{out}}{P_{in}} = \frac{\frac{V_{ol}^2}{R_{ll}}}{\frac{V_{sl}^2}{R_{sl}}} \quad \text{Eq. 4}$$

$$= G_v^2 \cdot \frac{R_{sl}}{R_{ll}} = R_{ll} \cdot \frac{R_{sl}}{R_1^2}$$

The values for series feedback resistor $R_1$, shunt feedback resistor $R_2$, capacitor $C_1$ and inductor $L_1$ are selected based on the amount of linear amplification and the amount of gain required for a specific application.

Design requirements and performance characteristics are required for specific applications. For example, a wireless communications standard, such as Enhanced Data for GSM Evolution (EDGE) uses 8 PSK modulation techniques, which is a non-constant modulation technique that requires all the signal processing elements to be linear in order to reduce distortion. The table below is an example of the design requirements and performance characteristics for a small signal amplifier, such as an Intermediate Frequency (IF) amplifier, used in the transmit chain of a transmitter supporting EDGE modulation.

TABLE 1

| Design Requirements $F_c$ = 208 MHz | |
|---|---|
| $V_{ce}$ = 7.2 V and | $I_c$ = 52 mA |
| $R_{s1}$ = 50 Ohms | $R_{l1}$ = 50 Ohms |
| Required Performance Characteristics | |
| Gain | 15.0 +/− 0.5 dB |
| I/O Return Loss | <−12 dB |
| OIP3 | >35 dBm |
| Noise Figure (NF) | <4.0 dB |

Transistor amplifier 50 may utilize an n-p-n bipolar junction transistor, for example, a Philips BJT BFG541, for transistor Q1. Using the design requirements in Table 1, the optimum load resistor the transistor wants to see for maximum linear power is Vce/Lc. Appropriate selection of series feedback resistor $R_1$ and shunt feedback resistor $R_2$ converts output impedance $Z_{o1}$ to the optimum load. Capacitor $C_1$ and inductor $L_1$ converts load resistance $R_{l1}$ to an optimum load so that transistor 52 may provide maximum linear power and converts output impedance $Z_{o1}$ from the optimum load to match load resistance $R_{l1}$ so that minimum return loss may be achieved at the operating frequency. If input impedance $Z_{i1}$ is set equal to the conjugate of source resistance $R_{s1}$ and output impedance $Z_{o1}$ is set equal to the optimum load request the pre-selected gain, shunt feedback resistor $R_2$ and series feedback resistor $R_1$ can be calculated using equations 2, 3 and 4. Table 2 list values for the critical amplifier components. The table below provides the values necessary to meet the design requirements imposed in table 1.

TABLE 2

| IF Amplifier Component Values | |
|---|---|
| $R_1$ = 9 ohms | $C_1$ = 6.8 pF |
| $R_2$ = 560 ohms | $L_1$ = 39 nH |
| $Z_{i1}$ = 50 Ohms | $Z_{o1}$ = 141 ohms |

Figure 2:
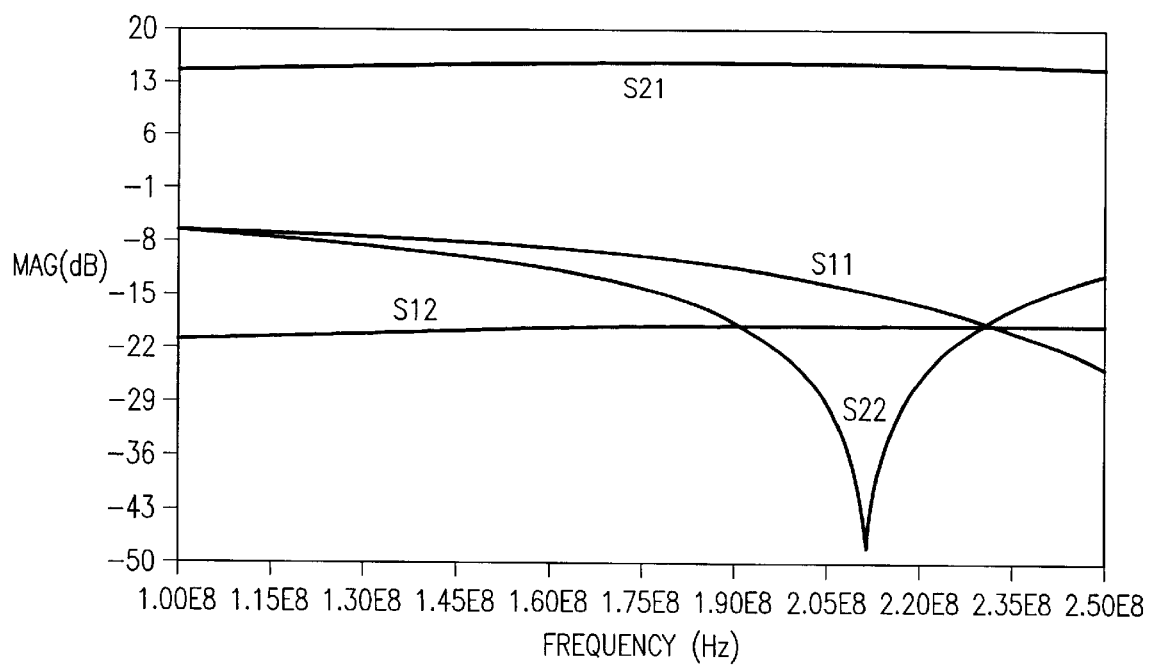
FIG. 2 is a chart illustrating small signal S parameters measured from the transistor amplifier of FIG. 1.
Figure 3:
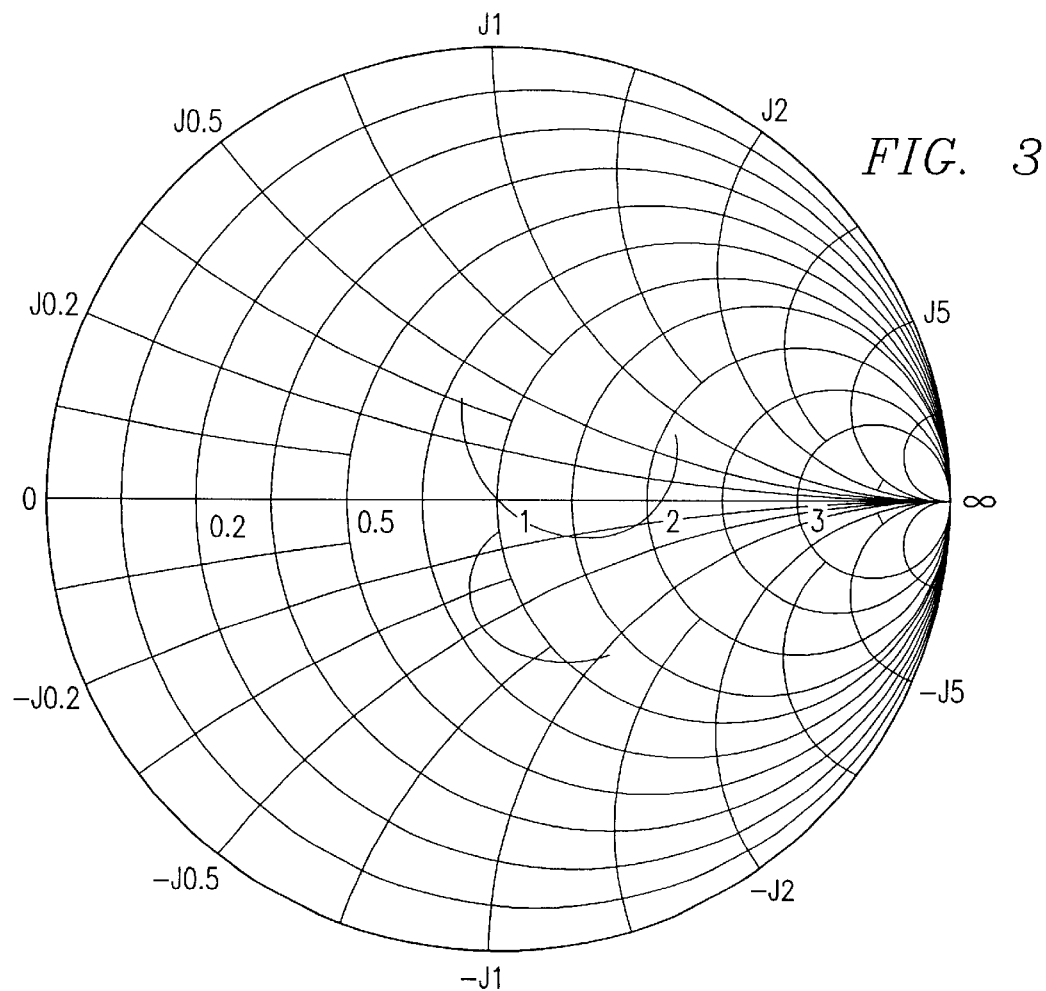
FIG. 3 is the S parameter data measured and illustrated in the chart of FIG. 2 plotted on a smith chart.
Figure 4:
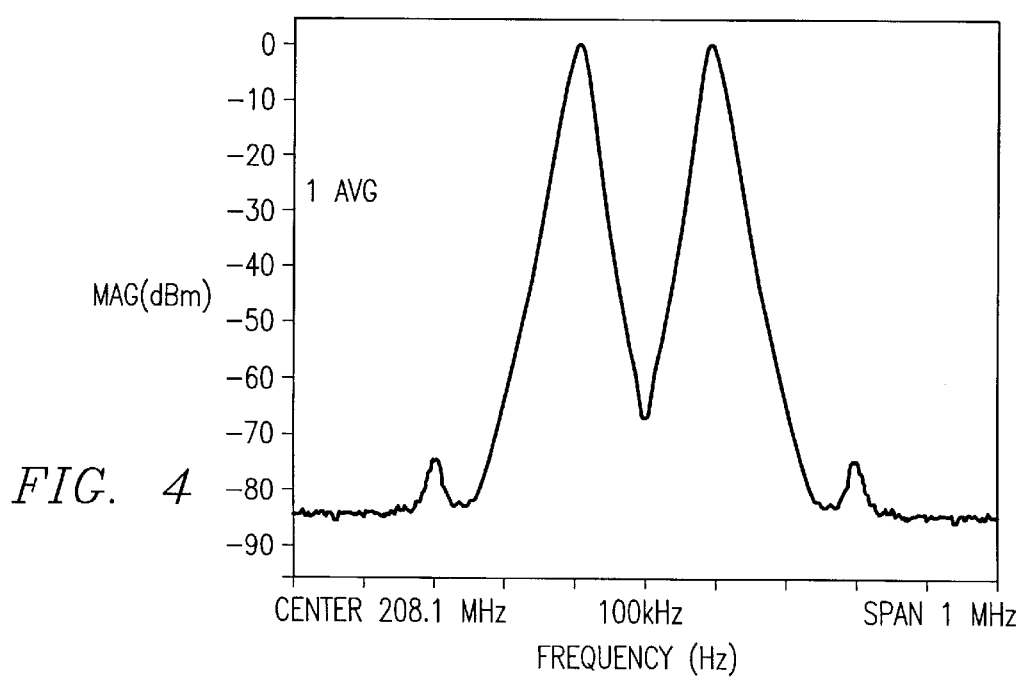
FIG. 4 is a chart illustrating the measurement of a third order inter-modulation product (OIP3) for the transistor amplifier of FIG. 1

Turning now to FIG. 2 where a chart illustrating small signal S parameters measured from transistor amplifier 50 having application design requirements and performance characteristics of Table 1. FIG. 2 illustrates values for the power gains S21 and S12 and the reflection coefficients S11 and S22. Power gain S21 is the forward power gain measured at RF input 54 and power gain S12 is the reverse power gain measure at RF out put 56. Reflection coefficient S11 is the amount of signal reflection as measured at RF input 54 and reflection coefficient S22 is the amount of signal reflection measured at RF output 56. FIG. 2 illustrates that at or near the intermediate frequency the performance requirements defined in Table 1 for the power gain S21 and the return loss S11 have been achieved. FIG. 3 illustrates the S parameter data measured and illustrated in FIG. 2 plotted on a smith cart. FIG. 4 is a chart illustrating the measurement of a third order inter-modulation product (OIP3) for transistor amplifier 52. FIG. 4 shows an OIP3 of 37.3 dBm, which meets the specification requirements for an EDGE application as that described in table 1.

While this invention has been described with reference to particular embodiments, this description is not intended to be limiting. Various modifications and combinations of the illustrative embodiments, as well as other embodiments of the invention, will be apparent to persons skilled in the art. It is, therefore, intended that the appended claims encompass any such modifications or embodiments.

What is claimed is:

1. A transistor amplifier for coupling between a sending circuit having a source voltage at a predetermined frequency and a source resistance and a receiving circuit having a load resistance, the transistor amplifier comprising:

a transistor having a base, a collector and an emitter, the base having an input impedance and the collector having an output impedance;

a dual loop feedback control circuit for converting the input impedance to a conjugate of the source resistance and the output impedance to an optimum load impedance, the optimum load impedance equals the collector emitter voltage divided by the collector current, the dual loop feedback control circuit comprising a shunt feedback resistor electrically coupled between the collector and the base and a series feedback resistor electrically coupled between the emitter and a ground potential; and impedance matching circuit for converting the load resistance to a conjugate of the output impedance and the output impedance from the optimum load to a conjugate of the load resistance at the predetermined frequency, the impedance matching circuit electrically coupled between the collector and the receiving circuit.

2. The transistor amplifier as recited in claim 1, wherein the transistor further provides a collector emitter voltage and a collector current as required to provide a select amount of linear power.

3. The transistor amplifier as recited in claim 1, wherein a voltage gain approximately equal to the division of the load resistance by the series feedback resistance.

4. The transistor amplifier as recited in claim 1, wherein a power gain of the transistor amplifier is approximately equal to the load resistance multiplied by the division of the source resistance by the square of the series feedback resistance.

5. The transistor amplifier as recited in claim 1, wherein the shunt feedback resistor approximately equals the optimum load impedance multiplied by the division of the source resistance by the source voltage.

6. The transistor amplifier as recited in claim 1, wherein the series feedback resistor approximately equals the optimum load impedance multiplied by the division of the source resistance by the shunt feedback resistor.

7. The transistor amplifier as recited in claim 1, wherein the impedance matching circuit comprises an inductor and a capacitor.

8. The transistor amplifier as recited in claim 1 further comprising a bias control circuit, the bias control circuit comprising:

a voltage source electrically coupled to the collector through a first resistor and to the base through a second resistor;

a first inductor electrically coupled between the first resistor and the bias voltage source and a second inductor electrically coupled between the bias voltage source and the second resistor;

a first DC blocking capacitor electrically coupled between the shunt feedback resistor and the base;

a second DC blocking capacitor electrically coupled between the base and the sending circuit; and a third DC blocking capacitor electrically coupled between the collector and the receiving circuit.

9. A transistor amplifier for coupling between a sending circuit having a source resistance and providing an input signal with a predetermined frequency and a receiving circuit having a load resistance, the transistor amplifier comprising:

a Common Emitter (CE) Bipolar Junction Transistor (BJT), the CE BJT having a base electrically coupled to the sending circuit, a collector electrically connected to the receiving circuit and an emitter electrically coupled to a ground potential, the base having an input impedance, the collector having an output impedance;

a dual loop feedback control circuit for converting the input impedance to a conjugate of the source resistance and converting the output impedance to an optimum load impedance, the optimum load impedance approximately equals the collector emitter voltage divided by the collector current; and an impedance matching circuit for converting the load resistance to a conjugate of the output impedance and the output impedance to a conjugate of the load resistance at the predetermined frequency, the impedance matching circuit electrically coupled between the collector and the receiving circuit.

10. The transistor amplifier as recited in claim 9, wherein the sending circuit further provides a input signal of a predetermined frequency of about 208 Mhz.

11. The transistor amplifier as recited in claim 9, wherein the sending circuit further comprises having a source resistance of about 50 Ohms.

12. The transistor amplifier as recited in claim 9, wherein the receiving circuit further comprises having a load resistance of about 50 Ohms.

13. The transistor amplifier as recited in claim 9, wherein the CE BJT further comprises a collector emitter voltage of about 7.2 Volts and a collector current of about 52 mA.

14. The transistor amplifier as recited in claim 9, wherein the dual loop feedback control circuit comprising;

a shunt feedback resistor electrically coupled between the collector and the base, the shunt feedback resistor approximately equals 560 Ohms; and a series feedback resistor electrically coupled between the emitter and the ground potential, the series feedback resistor approximately equals 9 ohms.

15. The transistor amplifier as recited in claim 9, wherein the impedance matching circuit comprising;

an inductor of approximately 39 nH; and a capacitor of approximately 6.8 pF.

16. The transistor amplifier of claim 9 further comprises the transistor amplifier having a gain of approximately 15 dB.

17. The transistor amplifier of claim 9 further comprises the transistor amplifier having a return loss of approximately negative 12 dB.

18. The transistor amplifier of claim 9 further comprises the transistor amplifier having an output third order intermodulation product greater than 35 dBm.

19. The transistor amplifier of claim 9 further comprises the transistor amplifier having a noise figure less than 4.0 dB.

* * * * *